United States Patent
Vander Voorde et al.

(10) Patent No.: US 11,539,328 B2
(45) Date of Patent: Dec. 27, 2022

(54) TIMING CIRCUIT FOR LOCKING A VOLTAGE CONTROLLED OSCILLATOR TO A HIGH FREQUENCY BY USE OF LOW FREQUENCY QUOTIENTS AND RESISTOR TO SWITCHED CAPACITOR MATCHING

(71) Applicant: SEMICONDUCTOR COMPONENTS INDUSTRIES, LLC, Phoenix, AZ (US)

(72) Inventors: Lucas Emiel Elie Vander Voorde, Heindonk (CZ); Jan Plojhar, Mokra Horakov (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 42 days.

(21) Appl. No.: 17/095,085

(22) Filed: Nov. 11, 2020

(65) Prior Publication Data
US 2022/0021361 A1    Jan. 20, 2022

Related U.S. Application Data

(60) Provisional application No. 63/052,167, filed on Jul. 15, 2020.

(51) Int. Cl.
*H03B 5/02*    (2006.01)
*H03B 5/12*    (2006.01)
(Continued)

(52) U.S. Cl.
CPC .......... *H03B 5/1237* (2013.01); *H03B 5/129* (2013.01); *H03B 5/1271* (2013.01);
(Continued)

(58) Field of Classification Search
CPC .......... H03B 5/00; H03B 5/02; H03B 5/1237; H03B 5/1262; H03B 5/1265; H03B 5/129
(Continued)

(56) References Cited

U.S. PATENT DOCUMENTS 5,982,241 A    11/1999 Nguyen et al.
11,115,036 B1 *  9/2021 Zhao ................ H03L 7/0995
(Continued)

OTHER PUBLICATIONS

Jung et al., "A 1.08-nW/kHz 13.2-ppm/° C. Self-Biased Timer Using Temperature-Insensitive Resistive Current," IEEE Journal of Solid-State Circuits, vol. 53, No. 8, Aug. 2018.

*Primary Examiner* — William Hernandez
(74) *Attorney, Agent, or Firm* — Brake Hughes Bellermann LLP

(57) ABSTRACT

Devices, systems, and methods for locking a voltage controlled oscillator (VCO) at a high frequency may include use of a VCO and an integrator, which generates and outputs a control signal to the VCO, based on an inverting signal and a reference signal. The control signal locks the VCO to a high frequency signal (FH). A frequency divider is coupled to the VCO, receives FH from the VCO, divides FH by a factor "F", and outputs a low frequency signal (FL). A switched capacitor resistor circuit (SCRC) is coupled to the frequency divider and the integrator. The SCRC receives FL from the frequency divider and generates the inverting signal. An integrating capacitor is coupled across an inverting and an output terminal of op-amp in the integrator. The output of the op-amp provides an integrator signal, which may be (optionally) filtered to produce the control signal.

21 Claims, 4 Drawing Sheets

(51) Int. Cl.
  *H03F 3/45*     (2006.01)
  *H03K 5/00*     (2006.01)
  *H03L 7/00*     (2006.01)
(52) U.S. Cl.
  CPC ....... *H03B 5/1293* (2013.01); *H03F 3/45475* (2013.01); *H03K 5/00006* (2013.01); *H03L 7/00* (2013.01)
(58) Field of Classification Search
  USPC .................................. 327/100, 113, 115, 117
  See application file for complete search history.

(56) References Cited

U.S. PATENT DOCUMENTS

| | | | |
|---|---|---|---|
| 2019/0235566 A1* | 8/2019 | Ensafdaran | ............... G06F 1/10 |
| 2020/0313616 A1* | 10/2020 | Tsuji | ....................... H03L 7/091 |
| 2020/0366241 A1* | 11/2020 | Tsuji | ....................... H03B 5/04 |
| 2022/0021338 A1 | 1/2022 | Plojhar | |

* cited by examiner

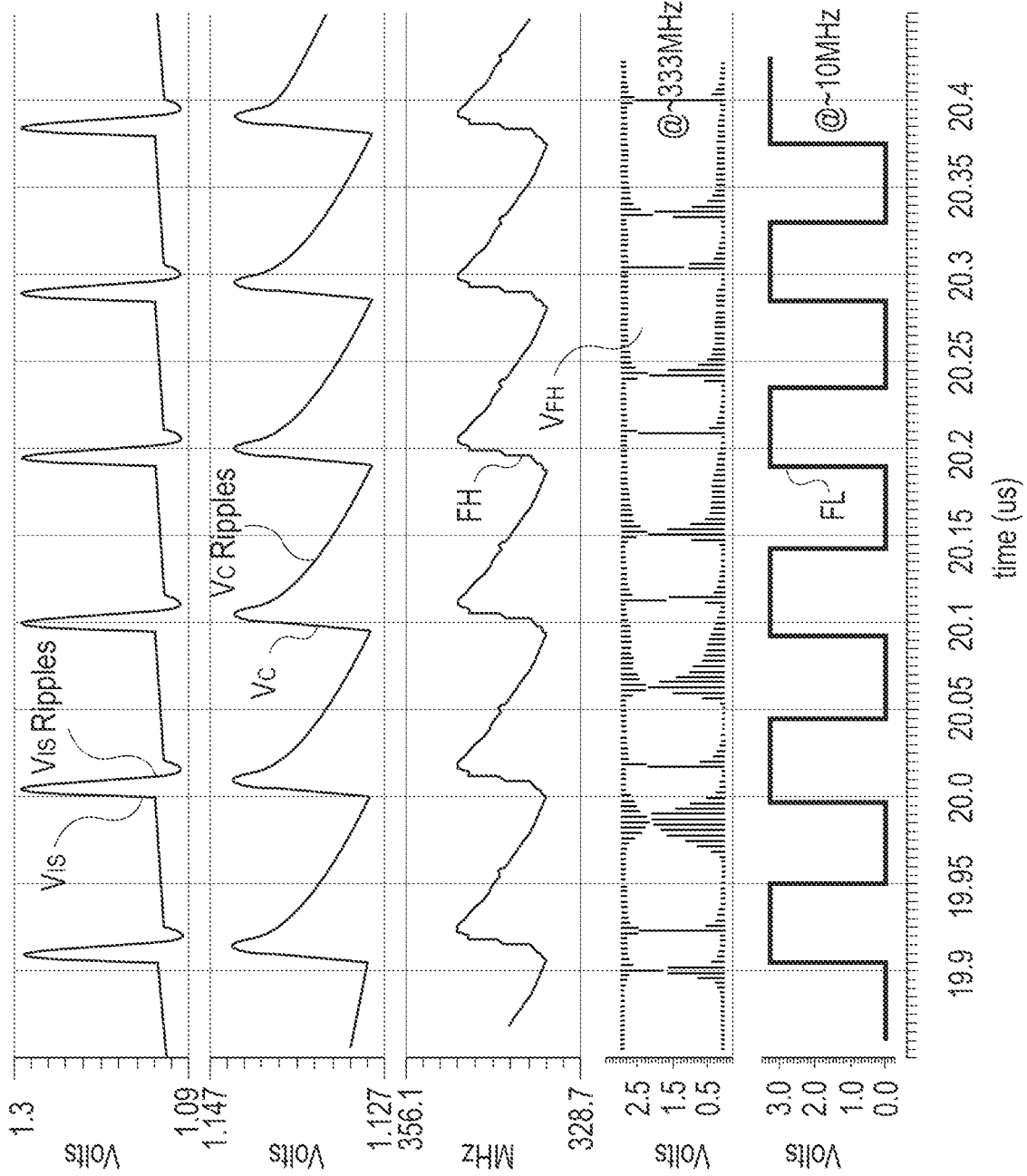

ND RESISTOR
TIMING CIRCUIT FOR LOCKING A VOLTAGE CONTROLLED OSCILLATOR TO A HIGH FREQUENCY BY USE OF LOW FREQUENCY QUOTIENTS AND RESISTOR TO SWITCHED CAPACITOR MATCHING

CROSS REFERENCE TO RELATED APPLICATIONS

The present application claims priority to U.S. Provisional Application Ser. No. 63/052,167, filed on Jul. 15, 2020, in the name of inventors Lucas Emil Elie Vander Voorde and Jan Plojhar, and entitled, "Voltage-Controlled Oscillator with Trimming," the entire contents of which are incorporated herein by reference.

The present application also relates to U.S. application Ser. No. 17/095,117, which was co-filed herewith on Nov. 11, 2020, entitled "RC Time Base Locked Voltage Controlled Oscillator", the entire contents of which are incorporated herein by reference.

TECHNICAL FIELD

The technology described herein generally relates to timing circuits. The technology also generally relates to locking voltage controlled oscillators at high frequencies. The technology described herein also relates to locking voltage controlled oscillators to higher output frequencies based on of lower frequency signals that are quotients of the higher frequency. The technology described herein also relates to the use of switched capacitance to resistance circuits to lock voltage controlled oscillators at high frequencies. The technology described also relates to controller area network transmitters.

BACKGROUND

As is commonly appreciated, Controller Area Network (CAN) communications commonly use two signal wires. The communications are sent as fully differential signals in order to provide robust data integrity, generate minimal electromagnetic radiation, and negate use of cable shielding. CAN is commonly used in automobiles and other implementations. CAN signals are commonly generated by a transceiver based on timing signals received from, for example, a crystal oscillator, a voltage controlled oscillator (VCO), a combination thereof, or otherwise.

It is appreciated that when the paired CAN lines transmit differential signals with different voltage potentials, a common mode signal may occur on the transmission line. For example, the common mode signal may arise when the voltage on a "P" line plus the voltage on an "N" line is not constant over time. When arising, the common mode signal may result in an emission of undesired electromagnetic energy.

To provide nicely differential signals in a signal transmitted on a CAN, is desirably symmetrical—e.g., avoids sharp voltage peaks and the like. To generate symmetrical transmitted signals, high frequency timing signals are often used. At high frequencies, such as those greater than one-hundred megahertz (100 MHz), the generation of such timing signals by a VCO, is often difficult, with conventional approaches commonly including the use of external oscillators, phased-lock loops with lower frequency source clocks, and the like.

Further, it is to be appreciated that a symmetrical transmitted signal, such as one shaped as a raised cosine for use on a CAN, commonly uses a lower emitted energy content. The shaping of a transmitted signal depends, in large part, on the frequency of the timing signal used. A high frequency timing signal enables a transceiver to shape the transmitted signal without any time used for signal shaping being time consuming, where "time consuming" is determined, for example, in view of a given data rate for a given CAN line. For example, an amount of time used in shaping a transmitted signal should not interfere with a given data/symbol rate used.

Commonly, a maximum slope time is commonly used to define the slowest "raised cosine" frequency at which the data/bit rate can be achieved in a transmitted signal on a CAN. If a transmitted signal, has a steep edge, even a slight phase difference can arise between two CAN lines. Further, the transmitted signal, desirably will approximate a raised cosine waveform. When a raised cosine waveform is not used, even subtle differences can result in the transmitted signals and, thereby, in undesired electromagnetic radiation being emitted in the transmitted signal.

It is appreciated that a given transmitted signal on a CAN may be generated by a transceiver as a piecewise approximation of the raised cosine waveform. As the number of steps increases, with more steps resulting in smaller steps, the approximated raised cosine waveform takes an ever better form. Implementations of circuits for generating such transmitted signals are often limited by switching speeds in a driver, with a design choice often being made between speed and accuracy. Accordingly, a high frequency timing signal is often used to generate the smaller steps used by a transceiver to generate a transmitted signal on a CAN.

Further, current systems often result in timing signals that have significant spikes at, or about, a center frequency. When the center frequency is at a low frequency, the resulting spikes can result in the generation of undesired electromagnetic radiation by the timing signal. Thus, a need exists for VCO circuits that generate symmetrical, high frequency timing signals for use in CAN and other implementations.

Accordingly, circuits and methods are needed which address these and other concerns.

SUMMARY

The various embodiments of the present disclosure describe circuits and methods for locking VCOs to high frequencies using low frequency quotients and resistor to switched capacitor matching.

In accordance with at least one embodiment of the present disclosure, a circuit includes a voltage controlled oscillator (VCO) and an integrator operable to generate and output a control signal to the VCO. The integrator is operable to receive an inverting signal and a reference signal, where the control signal locks the VCO to a high frequency signal based upon the inverting signal, where the inverting signal is received in response to a low frequency signal, and where the low frequency signal is a quotient of the high frequency signal.

Implementations may include one or more of the following features. The circuit may include: a frequency divider, coupled to the VCO, operable to: receive the high frequency signal from the VCO; divide the high frequency signal by a factor F; and output, based on the dividing of the high frequency signal, the low frequency signal. The frequency divider further may include: two or more flip-flop stages operable to successively divide the high frequency signal into the low frequency signal. The low frequency signal has a given period $T_{FL}$; and where during the given period $T_{FL}$, ripples are generated by the integrator in the control signal and the VCO generates jitter in a frequency of the high frequency signal. The jitter distributes the high frequency signal over a wider frequency band; and where an amplitude of an individual frequency component of the high frequency signal may be reduced.

For an implementation, F equals thirty-two. A period of the low frequency signal may be generated as a given number of periods of the high frequency signal ($T_{FH}$); where the low frequency signal has a given period $T_{FL}$; and where the circuit further may include: a frequency divider operable to output the low frequency signal; and a switched capacitor resistor circuit (SCRC), coupled to the frequency divider and the integrator, operable to: receive the low frequency signal from the frequency divider; and based on a frequency of the low frequency signal, generates the inverting signal.

The SCRC may be operable to: receive the low frequency signal; generate, in response to a frequency of the low frequency signal, the inverting signal by: during a first phase of a given period $T_{FL}$ of the low frequency signal, coupling a switched capacitor to a ground potential; and charging the switched capacitor by a second reference signal; and during a second phase of the given period Ta of the low frequency signal, coupling the switched capacitor to the integrator; and outputting the inverting signal to the integrator. The inverting signal may include an inverting voltage signal and an inverting current signal. The integrator may be operable to force the inverting voltage signal to equal the reference signal. The inverting current signal results in the integrator generating the control signal. The integrator further may include: an op-amp that may include: an inverting node; a noninverting node; and an output node; and an integrating capacitor coupled to the noninverting node. The integrating capacitor has an integrator capacitance. The switched capacitor has a switched capacitance. The VCO may be coupled to the output node.

The inverting signal further may include an inverting voltage signal and an inverting current signal. The inverting voltage signal may be provided at the inverting node. During the second phase, the inverting current signal charges the integrating capacitor. The reference signal may be provided at the noninverting node. The reference signal may equal the second reference signal. The reference signal may be generated from a supply voltage. The control signal may be generated based upon a product of the supply voltage times the switched capacitance and the product being divided by the integrator capacitance.

The SCRC further may include: a first switch for selectively coupling a top terminal of the switched capacitor, via a terminal A, to a ground potential, and via a terminal B, to the supply voltage; a second switch for selectively coupling a bottom terminal of the switched capacitor, via a terminal C, to the integrator and via a terminal Dd, to a reference circuit; and a discharge resistor R coupled at a bottom terminal to ground and at a top terminal to the inverting node and to terminal C of the second switch. The reference circuit further may include: a first reference resistor coupled between the supply voltage and to the non-inverting node; and a second reference resistor coupled between the non-inverting node and the ground. During the first phase of the given period $T_{FL}$, a discharge current flows from the integrating capacitor to ground via the discharge resistor R.

For at least one embodiment, the circuit also includes a voltage controlled oscillator (VCO), a reference circuit, and an integrator. The integrator may include: an op-amp that includes: an inverting node, a non-inverting node coupled to the reference circuit, and an output node coupled to the VCO. The circuit also includes an integrator capacitor coupled to the non-inverting node and the output node. The circuit also includes a switched capacitor resistor circuit (SCRC) that may include: a first switch including a terminal A and a terminal B; a second switch including a terminal C and a terminal D; a switched capacitor coupled to the first switch and to the second switch. The switched capacitor has a top terminal and a bottom terminal and may be selectively coupled at the top terminal, to a ground potential, when the first switch selects terminal A; and to a supply voltage, when the first switch selects terminal B. The switched capacitor may be selectively coupled at the bottom terminal to the inverting node when the second switch selects terminal C, and to the reference circuit when the second switch selects terminal D.

The circuit also includes a discharge resistor coupled between the ground potential and the inverting node. A given period $T_{FL}$ for a low frequency signal includes a first phase followed by a second phase. During the first phase, the first switch selects terminal A; the second switch selects terminal D; and charges received during a prior operating cycle from the SCRC and stored in the integrator capacitor are discharged to ground via the discharge resistor. During the second phase, the first switch selects terminal B; next, the second switch select terminal C; and an inverting signal generated by the SCRC charges the integrator capacitor. Charging and discharging of the integrator capacitor results in the integrator generating an integrated signal. The integrated signal may be used to generate a control signal provided to the VCO. The VCO may be locked to and output a high frequency signal.

For at least one embodiment, a circuit may include: a frequency divider, coupled to the VCO and the SCRC. The frequency divider generates the low frequency signal based on the high frequency signal received from the VCO. The frequency divider further may include: "N" flip-flop stages, operable to successively divide the high frequency signal. The integrator may be operable to generate ripples in the control signal. Based on the ripples in the control signal, the VCO may be operable to generate jitter in a frequency of the high frequency signal. For at least one embodiment, N equals five stages. Ripples in the control signal may be approximately fifteen millivolts (15 mv) peak-to-peak. The jitter in the frequency of the high frequency signal may be approximately fifteen megahertz (15 mhz).

The circuit may include: a filter operable to receive the integrated signal from the integrator, filter the integrated signal to generate the control signal, and output the control signal to the VCO. A period of the low frequency signal may be proportional to a resistance of the discharge resistor times a capacitance of the switched capacitor.

The reference circuit further may include: a first reference resistor; a second reference resistor; a third reference resistor; and a fourth reference resistor. A Wheatstone bridge may be formed by a first divider string may include a switched capacitor resistor coupled to the discharge resistor; a second divider string may include the first reference resistor and the second reference resistor. The second divider string generates a reference signal. The reference signal may be provided to the non-inverting node. The Wheatstone bridge seeks equilibrium between the first divider string and the second divider string. When terminal C may be selected by the second switch, an inverting voltage signal charges the integrator capacitor. When equilibrium does not exist in the Wheatstone bridge, an inverting current signal may be provided to the integrator capacitor in the inverted signal. During the first phase, a third divider string, may include the third reference resistor and the fourth reference resistor. The third divider string may supply a second reference signal to the switched capacitor resistor. The second reference signal may pre-charge the switched capacitor.

A method may include generating a low frequency signal based on a high frequency signal. The high frequency signal may be generated by a voltage controlled oscillator. The method also includes selectively generating inverting signals based on the low frequency signal, and generating, based on the inverting signal, a control signal used to control the voltage controlled oscillator. The low frequency signal may be generated by a frequency divider. The inverting signal may be generated by a switched capacitor to resistor circuit that may include a switched capacitor and a discharge resistor. The inverting signal may be controlled by selectively switching a first switch coupling a top terminal of the switched capacitor between a supply voltage and a ground potential; and selectively switching a second switch coupling a bottom terminal of the switched capacitor between a reference circuit and an inverting node of an integrator. The low frequency signal may occur over a given period $T_{FL}$ that includes at least two phases. The selective switching of the first switch and the second switch may occur based on a then occurring phase for the given period $T_{FL}$. The control signal may be further generated based upon a reference signal provided by the reference circuit to the integrator. Ripples are generated in the control signal by the integrator. Based on the ripples, jitter may be generated in a frequency of the high frequency signal by the voltage controlled oscillator.

BRIEF DESCRIPTION OF THE DRAWINGS

The features, aspects, advantages, functions, modules, and components of the devices, systems and processes provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When the first reference label is used in the specification, the description is applicable to any of the similar components and/or views having the same first reference number irrespective of any additional alphabetic designators or second reference labels, if any.

FIG. 3A is a graphical representation of an integrated signal $V_{IS}$ generated by an integrator in the timing circuit of FIG. 2 and in accordance with at least one embodiment of the present disclosure.

FIG. 3B is a graphical representation of a control signal $V_C$ generated by a filter in the timing circuit of FIG. 2 and in accordance with at least one embodiment of the present disclosure.

FIG. 3C is a graphical representation of the frequency of the high frequency signal FH generated by a VCO in the timing circuit of FIG. 2 and in accordance with at least one embodiment of the present disclosure.

FIG. 3D is a graphical representation of the high frequency signal FH of FIG. 3C, as represented in a voltage over time domain, and as generated the VCO of the timing circuit of FIG. 2 and in accordance with at least one embodiment of the present disclosure.

FIG. 3E is a graphical representation of a low frequency signal LH generated by a divider in the timing circuit of FIG. 2 and in accordance with at least one embodiment of the present disclosure.

DETAILED DESCRIPTION

The various embodiments described herein are directed to timing circuits for generating high frequency timing signals. For at least one embodiment a timing circuit may be configured to lock a VCO to a high frequency. By using a high frequency, such as a frequency above one-hundred megahertz (100 MHz), voltage spikes that might otherwise result in undesired electromagnetic radiation ("EMR") may be avoided. EMR will commonly fall outside operating ranges for a vehicle or other device within which a CAN is being used. For at least one embodiment, the circuits and methods may be used in a timing circuit to generate, by a VCO, timing signals in the three-hundred megahertz (300 MHz) to four-hundred megahertz (400 MHz) range. For at least one embodiment, timing signals are generated that have a substantially center frequency of three-hundred and thirty-three megahertz (333 MHz). For at least one embodiment, the timing signals generated by the VCO locked to provide a high frequency output signal, may be used by a transceiver to generated a transmitted signal containing one or more Data/"symbols" over a CAN. The high frequency output signal generated by a VCO locked to so provide may be used with other implementations and are not limited to use with CANs.

Figure 1:
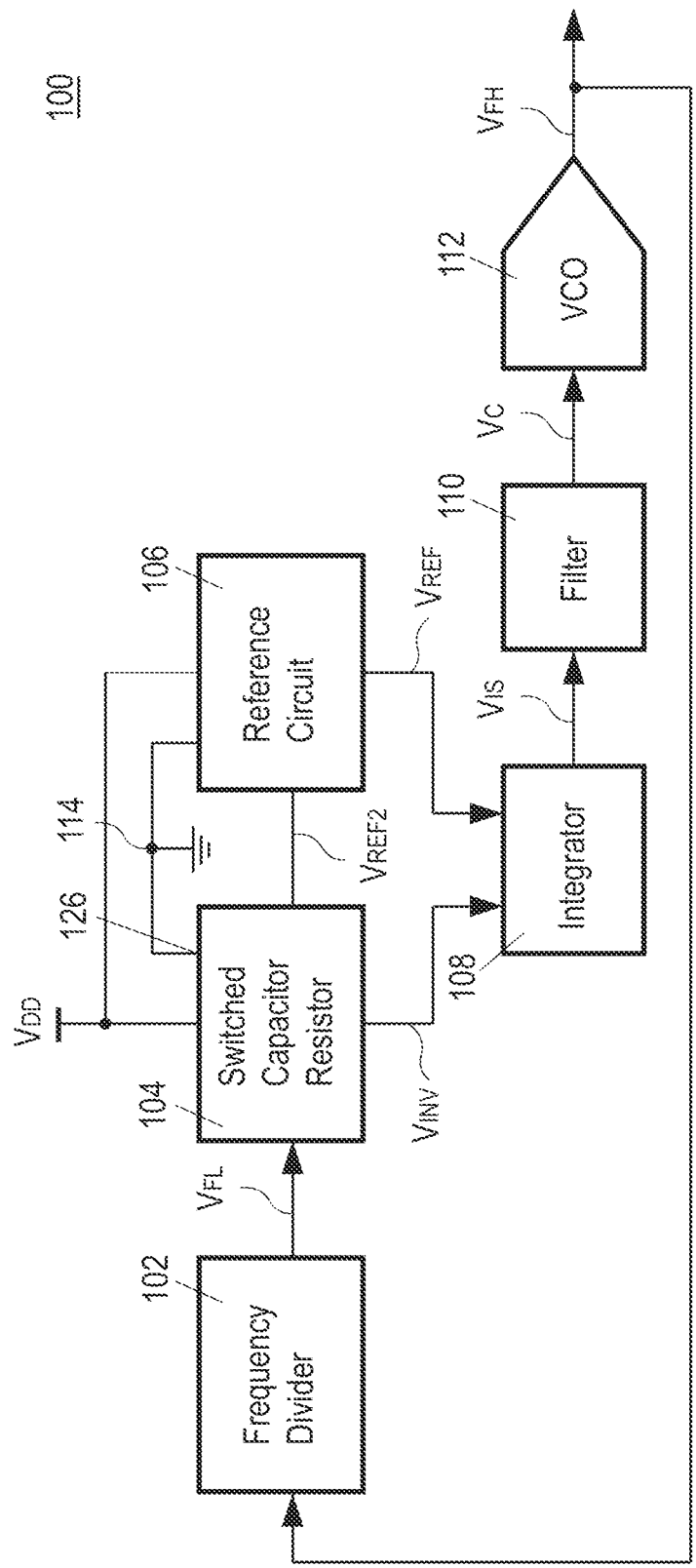
FIG. 1 is a schematic illustration of a timing circuit for locking a VCO output frequency at a high frequency using low frequency quotients and a switched capacitor to resistor matching circuit and in accordance with at least one embodiment of the present disclosure.

As shown in FIG. 1 and for at least one embodiment of the present disclosure, a timing circuit 100 may include a frequency divider circuit 102, a switched capacitor to resistor circuit (SCRC) 104, a reference circuit 106, an integrator 108, an optional filter 110, and a VCO 112.

The VCO 112 receives a control signal $V_C$. $V_C$ may be received from the filter 110 (when the filter 110 is separately provided) or from the integrator 108 (when the filter 110 is not separately provided). It is to be appreciated that functions performed by the filter 110 may be provided by the integrator 108 or separately.

Based on the received control signal $V_C$, the VCO 112 generates a high frequency signal/timing signal "FH." FH is generated by the VCO based on the voltages received in the control signal $V_C$. The high frequency signal FH may be output as a timing signal for use by other devices in a given implementation, such as in a given CAN implementation. The terms high frequency signal FH may be used as a timing signal, and such terms are used interchangeably herein. FH is also provided to the frequency divider circuit 102. The principles of operation of VCOs are well known and are not otherwise described herein. Any known or later arising VCO technology may be used in implementations of the various embodiments described herein.

Figure 3F:
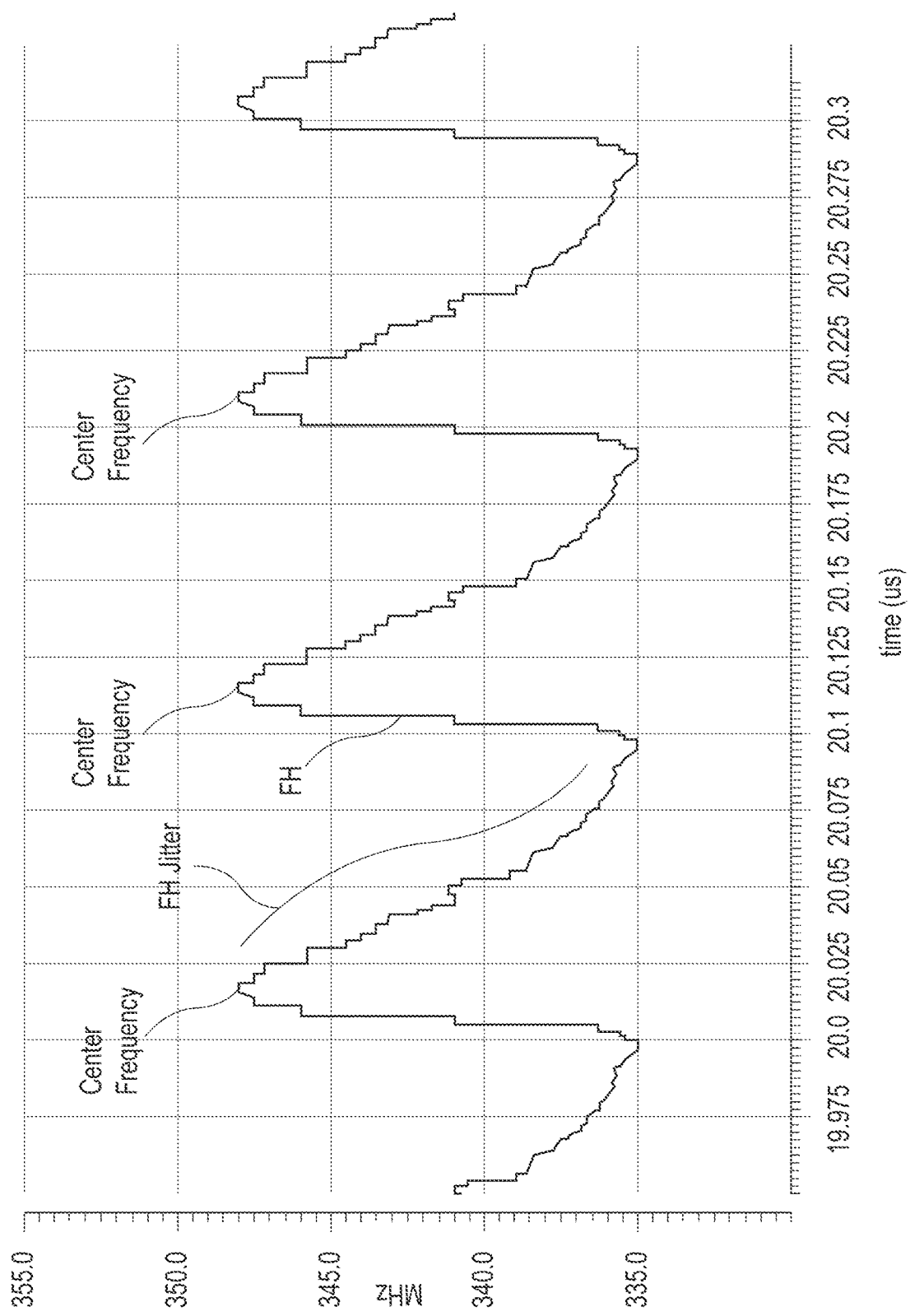
FIG. 3F is an enlargement of the graphical representation provided in FIG. 3C.

In FIGS. 3C and 3F, an illustrative and non-limiting representation of the high frequency signal FH is shown. The FH generally includes a symmetrical, repeating waveform that has a peak center frequency and multiple ripples. The high frequency signal FH is shown as arising over a bandwidth of approximately three-hundred and thirty-five megahertz (335 MHz) to three-hundred and fifty megahertz (350 MHz). Other ranges may be used for other embodiments. In FIG. 3D, an illustrative and non-limiting representation of output voltages generated by the VCO in the FH are shown. The output voltages form a quasi-square wave with a frequency of approximately three-hundred and thirty-three megahertz (333 MHz). For this non-limiting example, the voltage ranges from zero volts (0V) to approximately three-point-three volts (3.3V).

As further shown in FIG. 1, a frequency divider circuit 102 (which is also referred to herein in short as the "divider") divides the high frequency signal FH into a lower frequency signal FL. The division of the high frequency signal FH into the low frequency signal FL may occur using any number "N" of stages. The number of stages used by a given divider 102 is implementation specific. For at least one implementation, five (5) stages are used for a FH signal generated in the 300-400 MHz range, such stages result in an FL generated that ranges from approximately ten megahertz (10 MHz) to approximately thirteen megahertz (13 MHz). FL is output by the frequency divider circuit 102 and is used as a control/drive signal for the SCRC 104. The number of stages N may specify a factor F at which the high frequency signal FH is divided into the low frequency signal FL. For at least one embodiment, $F=2^N$.

In FIG. 3E, an illustrative and non-limiting representation of the low frequency signal FL is shown. As shown, FL is a square wave signal that toggles between zero volts (0V) and approximately three-point-three volts (3.3V), with a frequency of approximately ten megahertz (10 MHz) and a period of approximately one-hundred nanoseconds (100 ns).

As further shown in FIG. 1, the SCRC 104 is configured to receive the FL signal and a supply voltage $V_{DD}$. Based on the pulses received in the FL signal and the electrical potential provided by $V_{DD}$, the SCRC 1014 generates and outputs an inverted signal to the integrator 108. The inverted signal has a voltage component $V_{INV}$ (which is also referred to as the "inverting voltage signal") and a current component $I_{INV}$ (which is also referred to as the "inverting current signal"). $V_{INV}$ is provided as an inverting signal to the integrator 108. The reference circuit 106 also is provided with electrical energy by the supply voltage $V_{DD}$.

The reference circuit 106 generates a reference signal $V_{REF}$ (which is also referred to as the "non-inverting signal") which is provided to the integrator 108. A second reference signal $V_{REF2}$ is also generated and, for at least one embodiment, is substantially equal to the reference voltage $V_{REF}$. Based on the received inverting and non-inverting signals, the integrator generates and outputs an integrated signal $V_{IS}$.

In FIG. 3A, an illustrative and non-limiting representation of the integrated signal $V_{IS}$ is shown. As shown, the integrated signal provides a symmetrical, repeating waveform that includes voltages varying over time and over a range of approximately one-point-one volts (1.1V) to one-point-three volts (1.3). Other voltage ranges may be used for other embodiments. If left unfiltered, it is to be appreciated that the voltage spikes present in the integrated signal $V_{IS}$ may result in corresponding spikes in the voltages and frequencies generated in the high frequency signal FH by the VCO.

As shown in FIG. 1, the integrated signal $V_{IS}$ is filtered by filter 110. As shown in FIG. 3B, filtering of the integrated signal VIS may result in a control signal $V_C$ that avoids sharp voltage spikes while containing numerous voltage ripples.

Referring again to FIG. 1, with the providing of the control signal $V_C$ to the VCO, a regulation loop is provided which facilitates settling of the timing circuit 100 upon a center high frequency FH signal having multiple frequency jittering and where the center of the high frequency signal FH is based upon the RC values used in the SCRC 104. Also, one or more of the components of the timing circuit 100 may be suitably grounded or otherwise connected to a ground/common potential 114 ("GND").

For at least one embodiment, the VCO may be locked to a high frequency signal FH by adjusting one or more of the number of low frequency FL quotients used, as specified by the number of stages "N" used, and/or by tuning the SCRC, such as by adjusting the resistance provided by one or more resistors in the SCRC.

Further, it is to be appreciated that due to the varying voltage levels provided in the control signal $V_C$, iterative frequency corrections are performed by the VCO. These iterative corrections result in the ripples in the control signal $V_C$ and the jitters in a frequency of the high frequency signal FH. The frequency jittering enables the timing signal to be distributed across a wider bandwidth and thereby reduce effects of any higher order harmonics, or the like. Further, the voltage rippling in the control signal $V_C$ may occur independently of variations in temperature, the supply voltage $V_{DD}$, or the like. Any such variations will have minimum influence on the control signal $V_C$ and correspondingly on the high frequency signal FH. For at least one embodiment, rippling in the control signal $V_C$ may result in a timing signal having an energy distribution over a given frequency range, while being centered at a given operating frequency. The amount of rippling in the control voltage $V_C$ may be reduced or increased based upon the characteristics of the integrator 108 used for a given embodiment. Further, the jittering of the high frequency signal FH may result in a lower total power generated by a transmitter in a given frequency band. This, in turn, may result in greater receptivity by a receiving device due to less noise being present in the transmitted signals.

For at least one embodiment, a timing circuit may be configured to use wave shaping to generate timing signals that rise and fall within specified ranges. Such wave shaping may occur, for example, in view of the number of stages used in a divider 102. For example and not by limitation, a particular implementation of a CAN may have a range of transmitted signals which include rising edges occurring at approximately sixty nanoseconds (60 ns), with falling edges occurring at approximately one-hundred and twenty nanoseconds (120 ns). Other CAN implementations may use similarly symmetrical rising and falling edges, such as rising edges occurring between sixty nanoseconds (60 ns) and eighty nanosecond (80 ns) and falling edges occurring between one-hundred and twenty nanoseconds (120 ns) and one-hundred and sixty nanoseconds (160 ns) for a full period. For a given implementation, the divider 102 may be operable, based on a single period of FH, to accordingly generate a number of low frequency periods (herein, "Z periods"). Twenty (20) to thirty (30) Z periods may be generated over a half-period, and forty (40) to sixty (60) Z periods may be generated over a full period. Other ranges and/or numbers of Z periods may be used for other implementations. It is to be appreciated that as the number of Z periods increases, the amount of any error generated in a given timing signal will decrease. An increase in the number of Z periods used may result in an increase in a larger VCO. An increase in VCO size may have undesired space, heat, power, and other consequences.

The number of Z periods generated by the divider 102 based on a given high frequency signal FH may further relate to the frequency ranges to be used in a given transmitted signal. For example, if twenty (20) Z periods are to be used and a given period for the transmitted signal is sixty nanoseconds (60 ns), which corresponds to an operating frequency of 16.6 MHz, a transmitted period (herein, an "Xtr period") may be generated over three nanoseconds (3 ns), and a timing signal generated at approximately three-hundred and thirty-three megahertz (333 MHz) may be used to provide the given number of Xtr periods, here, twenty (20) to be used by a transceiver in shaping the transmitted signal used, for example and not by limitation, on a CAN. It is to be appreciated, however, that twenty (20) Xtr periods over a full period provides only ten (10) Xtr periods to form a given rising edge or a given falling edge of a transmitted signal. Accordingly, implementations may be configured to use higher numbers of Xtr periods, over a given period or portion thereof, such that a transmitted signal will be shaped and have a given form, such as a well-formed rising edge, a well-formed falling edge, and/or both.

For an embodiment, a timing circuit may be used that generate successive steps, in a timing signal, at speeds that are an order of magnitude greater than a given frequency used for a given transmitted signal. For example, a VCO may be configured to generate timing signals at 333 MHz while a transmitted signal output by a transceiver is at a lower frequency for example, and not by limitation, ten megahertz (10 MHz). The timing circuit may be provided as an on-chip oscillator.

To generate the timing signal reliably, the various embodiments described herein may be configured to use steps provided in the lower frequency signal FL. FL may be used in generating, by other circuit components, an inverting input signal to an integrator, with a non-inverting input signal to the integrator being provided by a reference circuit, with an integrated signal being generated.

For at least one embodiment, a timing circuit configured in accordance with an embodiment of the present disclosure may generate a timing signal that has a frequency accuracy of better than five percent (±5%) accurate. For at least one embodiment, the timing circuit used to lock a VCO and generate a higher frequency signal FH may be provided within a core circuit block, such as an IP block.

During a start-up phase, the timing circuit 100 may use multiple operating cycles before the timing circuit settles upon a given center frequency. Accordingly, to minimize start-up periods and for at least one embodiment, the timing circuit 100 may be provided with the supply voltage $V_{DD}$. While powered, the timing circuit 100 may increase a depletion rate of stored electrical energy, such as in devices operating on battery supplied power. Accordingly, it is to be appreciated that the timing circuit 100 may not be an optimal solution when electrical power used to operate the timing circuit 100 uses a supply voltage $V_{DD}$ provided by a stored or otherwise limited availability power source, such as a battery.

Figure 2:
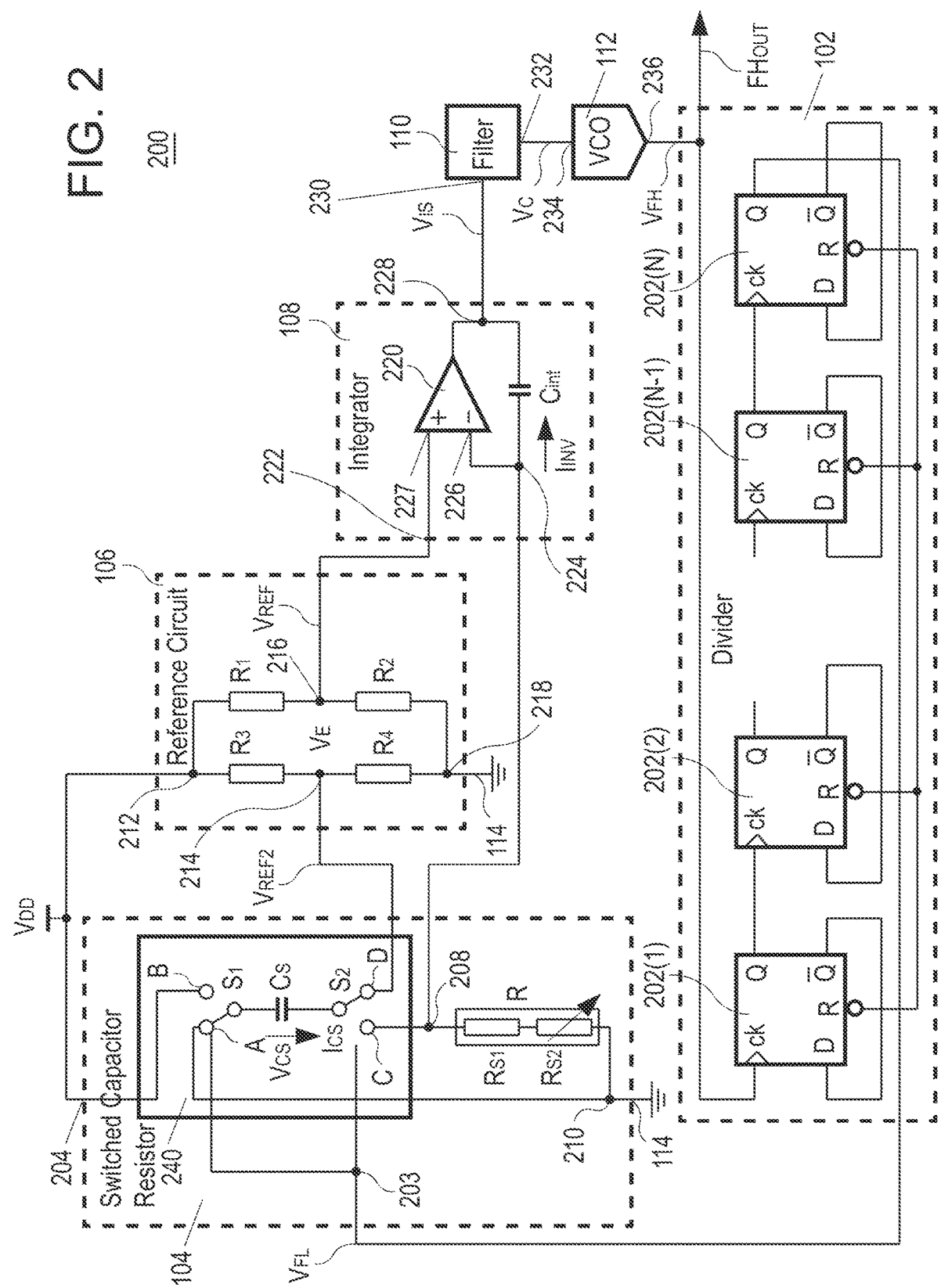
FIG. 2 is another schematic illustration of a timing circuit for locking a VCO at a high frequency using low frequency quotients and a switched capacitor to resistor circuit and in accordance with at least one embodiment of the present disclosure.

As shown in FIG. 2 and for at least one embodiment, a timing circuit 200 may include a divider 102 that is further configured to include one (1) to "N" stages 202(1)-202(N), where N is an integer. The N stages successively divide a received high frequency signal FH into a low frequency signal FL. The "N" stages may include use of flip-flops or other components operable to divide the high frequency signal FH into the low frequency signal FL. The low frequency signal FL is provided by the divider 102 to an SCRC 104. For at least one non-limiting embodiment, the low frequency signal FL may range from approximately one-hundred kilohertz (100 kHz) to less than ten megahertz (10 MHz).

The SCRC 104 may be configured to include at a first SCRS node 203 at which the low frequency signal FL is received from the divider 102. The SCRC 104 may include a first switch $S_1$ having a terminal A and a terminal B, and a second switch $S_2$ having a terminal C and a terminal D. The first switch $S_1$ and second switch $S_2$ may be configured to have opposing states and are driven by the low frequency signal FL, such that when S1 is at terminal A, S2 is at terminal D and when S1 is at terminal B, S2 is at terminal C. The SCRC 104 may further include a switched capacitor $C_S$ providing a switched capacitance SC, and a discharge resistor R having a first resistance $R_{S1}$ and an optional trimming resistance $R_{S2}$ and a total discharge resistance $R_D$. As discussed below, the combination of the first switch $S_1$, the second switch $S_2$, and the switched capacitor $C_S$ form a switched capacitor resistor "$R_{SC}$" 230.

The resistor(s) and capacitor used in an SCRC may be stable over temperatures ranging from minus fifty degrees Celsius (−50° C.) to one-hundred and fifty degrees Celsius (150° C.). As used herein, a stable temperature is a temperature that varies less than plus/minus ten percent (±10%) during a normal operating period. It is to be appreciated that the temperature may vary during start-up and shut-down modes of operation. The SCRC 104 and other components of the timing circuit 200 may be configured for use in a three-point-three volt (3.3V) gate transistor environment. The switched capacitor $C_S$ may be configured such that is settles within a given low frequency signal FL period $T_{FL}$.

Further, the use of the low frequency signal FL to drive the SCRC 104 reduces impacts of parasitics occurring in the switches S1 and S2 when such switches are driven above ten megahertz (10 MHz). Also, the low frequency signal FL facilitates generation of ripples in the control signal $V_C$ provided to the VCO, which due to the transfer function of the VCO results in jitter in the high frequency signal FH. For at least one embodiment, and as shown in FIG. 3F, a ripple of fifteen millivolts (15 mV) peak-to-peak results in a jitter of approximately fifteen megahertz (15 MHz) in a frequency of the high frequency signal FH. Other transfer functions in a VCO may be used for other embodiments to provide more or less jitter in frequencies of the high frequency signal based upon ripples in the control signal $V_C$.

The first switch S1 switchable connects, via terminal B, a top terminal of the switched capacitor $C_S$ with either a second SCRC node 204, at which a supply voltage $V_{DD}$ is provided, and via terminal A, connects the top terminal of the switched capacitor $C_S$ with a fifth SCRC node 210 coupled to GND 114. As shown, the switched capacitor $C_S$ may be charged directly from the supply voltage $V_{DD}$ and without use of a separate reference voltage source. Further, use of the switched capacitor $C_S$ results in a timing circuit 200 which is substantially insensitive to delays arising in the divider 102 when the switched capacitor $C_S$ and the integrator 108 settle correctly. Further, the parasitic capacitances of the switches S1 and S2 may not play a significant role in the accuracy of the regulation loop.

The second switch S2 switchable connects a bottom terminal of the switched capacitor $C_S$, via terminal D, with a third SCRC node 206, and via terminal C, with a fourth SCRC node 208. The third SCRC node 206 is coupled to the reference circuit 106. The fourth SCRC node 208 also couples the resistor R to an inverting node 224 for the integrator 108. The inverting voltage signal $V_{INV}$ occurs at the fourth SCRC node 208. The resistor R is also coupled to GND 114 via the fifth SCRC node 210.

The timing circuit 200 may include a reference circuit 106 that includes four reference resistors including a first reference resistor R1, a second reference resistor R2, a third reference resistor R3, and a fourth reference resistor R4. Each of the reference resistors have respective top leads and bottom leads. The first and third reference resistors R1/R3 are coupled, at their respective top leads, to the supply voltage $V_{DD}$ at a first reference circuit node 212. The second and fourth reference resistors R2/R4 are coupled, at their respective bottom leads, to a fourth reference circuit node 218 and thereby to the GND 114. The bottom lead of the third reference resistor R3 and the top lead of the fourth reference resistor R4 are coupled to second reference circuit node 214, which is further coupled to the third SCRC node 206. The bottom lead of the first reference resistor R1 and the top lead of the second reference resistor R2 are coupled to a third reference circuit node 216 which is further coupled to a non-inverting node 222 for the integrator 108.

The reference signal $V_{REF}$ occurs at the third reference circuit node 216 and the second reference signal $V_{REF2}$ occurs at the second reference circuit node 214. When the second switch S2 couples the switched capacitor $C_S$ to the reference circuit 106, a third divider string, is formed by the third reference resistor R3 and the fourth reference resistor R4. For at least one embodiment, the second reference signal $V_{REF2}$ is substantially equivalent to the reference voltage $V_{REF}$.

When connected to the switched capacitor via the second switch S2, the second reference signal $V_{REF2}$ pre-charges the switched capacitor $C_S$ to substantially the same voltage present on the inputs to the integrator 108 which is substantially equal to $V_{REF}$. Accordingly, $V_{REF}$ may be mathematically defined per Equation 1.

$$V_{REF} \cong \frac{V_{DD} \times R2}{(R1 + R2)} = \frac{V_{DD}}{2} \text{ (when } R1 = R2) \quad \text{Equation 1}$$

Further, the resistor R provides a circuit path from an inverting node 224 of the integrator and so from an integrator capacitor $C_{INT}$ (having an integrator capacitance "IC") to GND 114 and thereby R removes, over a full period $T_{FL}$, a charge (herein, the "removed charge" "$Q_R$") out of the integrator capacitor $C_{INT}$. It is to be appreciated that the following principles apply:

Q=Current $(I_{INV})$×Period $(T_{FL})$;     1)

$I_{INV}=V_{REF}/SR$;     2)

$V_{REF}=V_{DD}/2$;     3)

$Q_R=T_{FL}\times(V_{REF}/SR)$; and     4)

$Q_R=T_{FL}*(V_{DD}/2)/SR$.     5)

Accordingly, the charge removed $Q_R$ may be defined per Equation 2.

$$Q_R \cong \frac{T_{FL} \times V_{DD}}{2SR} \quad \text{Equation 2}$$

where "$T_{FL}$" is the period for a given low frequency signal FL cycle.

Each $T_{FL}$ may be split into two switching phases, phase 1 and phase 2. During each period $T_{FL}$, the switched capacitor $C_S$ compensates for the removed charge $Q_R$ and $V_{REF2}$ provides a pre-charge voltage to the switched capacitor $C_S$. $V_{REF2}$ may be further defined per Equation 3.

$$V_{REF2} \cong \frac{V_{DD} \times R1}{(R3 + R4)} = \frac{V_{DD}}{2} \quad \text{Equation 3}$$

(when $R3 = R4$, and when $R4$ is grounded)

During a first phase in period $T_{FL}$, the switched capacitor $C_S$ is coupled via S1, terminal A to GND 114 and via S2, terminal D to the reference circuit 106. During this first phase, the switched capacitor $C_S$ is charged to a phase 1 voltage ("$V_{CSPHASE1}$"). The phase 1 voltage may by defined per Equation 4.

$V_{CSPHASE1}=GND-V_{REF2}$     Equation 4:

Accordingly, during phase 1, a charge on the switched capacitor CS, ("$Q_{CS1}$") may be defined per Equation 5.

$Q_{CS1}=-SC*V_{REF2}$.     Equation 5:

During a second phase in period $T_{FL}$, $C_S$ is coupled, via S1, terminal B, to $V_{DD}$ and, via S2, terminal C to the fourth SCRC node 208, at which $V_{INV}$ is provided to the integrator 108. Since the op-amp 220 forces the inverting input 226 equal to the non-inverting input 227, after settling, $V_{INV}=V_{REF}$. Accordingly, a charge on switched capacitor during phase 2, ("$Q_{CS2}$") may be defined per Equation 6.

$Q_{CS2}=SC*(V_{DD}-V_{REF})$.     Equation 6:

Accordingly, the total charge delivered by the switched capacitance $C_S$ ("$Q_T$") may be defined per Equation 7.

$Q_T=Q_{cs2}-Q_{cs1}$.     Equation 7:

Since $V_{REF2} \approx V_{REF}$, over a single period $T_{FL}$, the total charge $Q_T$ is delivered by the switched capacitor $C_S$ to the inverting node 224 of the integrator 108 and is transferred to the integrator capacitor $C_{INT}$. $Q_T$ may be defined by Equation 8.

$Q_T=SC*V_{DD}$.     Equation 8:

To avoid losing part of the $I_{CS}$ charge provided to the switched capacitor $C_S$ during phase 1, phase 2 may include a sub-phase 2A, during which S2 is switched from terminal C to terminal D, and then a sub-phase 2B, during which S1 is switched from terminal A to terminal B.

At the end of each period $T_{FL}$, a charge on the integrator capacitor $Q_{INT}$ may be defined per Equation 9.

$Q_{INT}=Q_R-(Q_{CS2}-Q_{CS1})$     Equation 9:

Accordingly, the regulation loop settles when the voltage of the integrated signal ($V_{IS}$) stabilizes. Such stabilization occurs at the end of each low frequency period $T_{FL}$ and may be measured as a DC component when the condition of Equation 10 exists.

$Q_R=(Q_{CS2}-Q_{CS1})$.     Equation 10:

When the regulation loop settles, the relationship between the period $T_{FL}$ and the switched capacitance SC and the discharge resistance $R_D$ may be defined by Equations 11 and 12.

$SC*V_{DD}=T_{FL}*V_{DD}/2R_D$     Equation 11:

$T_{FL}=2*SC*R_D$.     Equation 12:

It is to be appreciated that Equation 12 can be derived based on Equations 2, 8, 10 and 11. Accordingly, when the regulation loop is not yet settled and the low frequency signal FL is too low, $T_{FL}$ will be too high (and vice versa). After each period $T_{FL}$ and per Equation 13 below, an increase (or a respective decrease) in the charge $Q_{INT}$ on the integrator capacitor $C_{INT}$ which result in an increase (or a respective decrease) in the control signal $V_C$ that further results in an increase (or a respective decrease) in the high frequency signal FH until an equilibrium is reached at the correct $T_{FL}$. Such equilibrium will be reached when the filter 110 and the overall gain of the timing circuit 200 are properly chosen, for example, based on experimental results, simulation, or otherwise using known procedures.

$$Q_{INT}=(T-(2*SC*R_D))*V_{DD}/R_D \qquad \text{Equation 13:}$$

At the end of phase 2, phase 1 is resumed by the timing circuit 200 executing, in sequence, a sub-phase 1A, during which the first switch S1 is switched from terminal B to terminal A, and a sub-phase 1B, during which S2 is switched from terminal C to terminal D. When the switches S1 and S2 states are reversed, phase 1 commences for a next operating cycle and the switch capacitor $C_S$ is again recharged to its initial charge by $V_{REF2}$.

A Wheatstone bridge (the "Bridge") facilitates regulation of the charge $Q_{INT}$ in the integrator capacitor $C_{INT}$ by use of the combination of the switching capacitor resistor $R_{SC}$ with the discharge resistor R in relation to the reference voltage $V_{REF}$. By switching S1 between GND and the supply voltage $V_{DD}$, it is to be appreciated that the integrator 108 is insensitive to variations in $V_{DD}$. In contrast, were the first switch S1 alternatively designed to be switched between $V_{REF}$ and the supply voltage $V_{DD}$, the integrator 108 may be sensitive to variations in the supply voltage $V_{DD}$.

More specifically, the Bridge includes a first divider string formed by the switched capacitor resistor $R_{SC}$ and the discharge resistor R, and a second divider string formed with the first reference resistor R1 and the second reference resistor R2.

When the low frequency signal FL is generated in the one-hundred kilohertz (100 kHz) to twelve megahertz (12 MHz) range (as may occur during a start-up or resumption of the timing circuit 200), the switched capacitor resistor $R_{SC}$ provides a switched capacitor resistor resistance "$R_{SCR}$". $R_{SCR}$ is proportional to the low frequency signal FL and to the switched capacitance SC—as mathematically expressed per Equation 14.

$$R_{SCR} \cong \frac{1}{FL \times SC} \qquad \text{Equation 14}$$

By using, at the first switch S1, the supply voltage $V_{DD}$ and GND as reference voltages, during start-up, the switched capacitor $C_S$ will have half the expected value. This results in a low ohmic source for both voltage references at the first switch S1. Accordingly, an extra reference buffer may not be needed.

Further, the Bridge compares the voltages between the first and second divider strings and seeks an equilibrium. Such equilibrium arises when R1 versus R2 has the same voltage potential as $R_{SCR}$ versus $R_D$.

If the Bridge is not in equilibrium and is not connected to the integrator 108, a voltage error ("$V_{ERROR}$") will arise. When the Bridge is connected to the integrator 108, the voltage error $V_{ERROR}$ is regulated by the integrator 108 towards zero volts (0V). The op-amp 220 and the integrator capacitor $C_{INT}$ form a feedback loop between the output node 228 and the inverting node 224 which draws the error current out of the Bridge. Such error current is integrated by the integrator capacitor $C_{INT}$ and results in a change in the integrated signal $V_{IS}$. Accordingly, an equivalent current is effectively formed which may be defined by Equation 15.

$$\frac{V_{ERROR}}{\left(R\|\left(\frac{1}{2\times SC \times FL}\right)\right)} = I_{INV} \qquad \text{Equation 15}$$

Further, in view of Equation 12, the low frequency signal FL used and the period $T_{FL}$, the low frequency signal FL and the high frequency signal FH may be mathematically expressed, in terms of the discharge resistance $R_D$ and the switched capacitance SC, as per Equation 16.

$$FL \cong \frac{1}{2 \times R_D \times SC} \cong \frac{FH}{F} \qquad \text{Equation 16}$$

The trimming resistor $R_{S2}$ may be used to adjust the discharge resistance $R_D$ and thereby adjust/tune the low frequency signal FL with respect to which the Bridge seeks to reach equilibrium. Since a fixed divider ratio may be used, the high frequency signal FH may be controlled in view of the discharge resistance $R_D$ and the switched capacitance SC used for a given implementation.

Further, the use of the Bridge facilitates comparisons being made, by the integrator 108, on a first order and with such comparisons being insensitive to low frequency variations in the supply voltage $V_{DD}$. It is to be appreciated that higher frequency variations in the supply voltage $V_{DD}$ may result in undesirable sampling and aliasing occurring in various components used in the timing circuit 200. It is to be appreciated that such low frequency variations and high frequency variations which may cause or not cause undesirable responses by the timing circuit 200 may be determined based on simulations, calculations, testing, use, or otherwise.

As further shown in FIG. 2, the integrator 108 includes an op-amp 220 having an inverting input 226 and a non-inverting input 227. The inverting input 226 is coupled to the inverting node 224 and to a first lead of an integrator capacitor $C_{INT}$. A second lead of the integrator capacitor $C_{INT}$ is coupled to an output lead of the op-amp 220 and an output node 228 of the integrator 108. The non-inverting input 227 of the op-amp 220 is coupled to the non-inverting node 222 of the integrator 108. The integrator 108 generates an integrated signal $V_{IS}$ (as shown in FIG. 3A and as discussed above).

It is to be appreciated that when the bridge is not in equilibrium, $V_{IS}$ will rise and fall with a slope that is defined by the inverting current signal $I_{INV}$. Since the currents into the op-amp 220 are ideally zero, the inverting current signal $I_{INV}$ will flow into the integrator capacitor $C_{INT}$. Accordingly, the relationship between the integrated signal $V_{IS}$ and the inverting current signal $I_{INV}$ can be expressed mathematically as per Equation 17.

$$\frac{dV_{IS}}{dt} \cong \frac{I_{INV}}{C_{INT}} \qquad \text{Equation 17}$$

Per Equations 15 and 17, the slope of $V_{IS}$ is proportional to the error voltage $V_{ERROR}$ between the two divider strings of the Bridge, which corresponds to the inverting signal current $I_{INV}$ through the integrator capacitor $C_{INT}$. Due to the regulation loop design, the timing circuit 200 will eventually settle to a $V_{IS}$ which brings the Bridge into equilibrium. Further, the integrating capacitance CI of the integrator capacitor $C_{INT}$ determines, in part, the amount of ripple provided in the control signal $V_C$ (and correspondingly the amount of jitter in the high frequency signal FH), with a higher capacitance providing less ripple. As shown in FIG. 3A, an initial spike on the integrated signal $V_{IS}$ commonly arises due to non-ideal op-amps being used, such as an op-amp 220 providing other than a zero (0) output impedance and having a finite reaction speed. The spike commonly occurs upon the first switch S1 connecting the switched capacitor $C_S$ from GND 114 to the supply voltage $V_{DD}$, which increases, via the integrator capacitor $C_{INT}$, the integrated signal $V_{IS}$ voltage. After a settling time, the op-amp 220 compensates for this transient voltage by reducing the integrated signal $V_{IS}$ voltage to a low potential and then integrating the charge from the switched capacitor $C_S$ into the integrator capacitor $C_{INT}$. Upon the charge being transferred from the switched capacitor $C_S$ to the integrator capacitor $C_{INT}$, the output voltage of the integrated signal $V_{IS}$ will have decreased to a level that may be determined based on the supply voltage $V_{DD}$, the switched capacitance SC and the integrating capacitance CI. This relationship can be mathematically expressed as per Equation 18.

$$V_{IS} \cong \frac{V_{DD} \times SC}{IC} \quad \text{Equation 18}$$

During the remainder of the given period $T_{FL}$, the influence of the resistor R and the continuous removing of the removed charge $Q_R$ out of integrator capacitor $C_{INT}$, where $C_{INT1}$ is substantially equivalent to the phase one charge $Q_{CS1}$, results in $V_{IS}$ rising again. Further, due to the discharge resistors' R continuous discharging of the integrator capacitor $C_{INT}$, during start-up, the control signal $V_C$ will continually rise, even when a low frequency signal FL is not present to drive the switches S1 and S2. Eventually, the control signal $V_C$ will become sufficiently high, the VCO will generating a high frequency signal FH, and regulation of the timing circuit 200 will occur.

As shown in FIG. 2, the timing circuit 200 may include a filter 110 that receives the integrated signal $V_{IS}$ and outputs a control signal $V_C$ to the VCO 112. For at least one embodiment, the filter 110 may use a passive low pass filter. The low pass filter may be used to reduce the magnitude of ripples occurring in the integrated signal $V_{IS}$. Such ripples may arise on top of a direct current (DC) component of the integrated signal $V_{IS}$. This results in the peak voltage ripples being reduced. As shown in FIGS. 3A and 3B, the peak voltage in $V_C$ is less than the peak voltages in $V_{IS}$.

The total bandwidth available for placement of a given high frequency signal FH may be determinative of one or more characteristics of the filter 110 used in any given implementation. More specifically, the filter 110 may be configured such that a roll off between ripples in the integrated signal $V_{IS}$ versus ripples in the control signal $V_C$ is sufficiently high such that the jitter in the high frequency signal FH is within a permitted bandwidth. It is to be appreciated that the relationship between the control signal $V_C$ and the voltages in the high frequency signal FH (as shown, for example, in FIG. 3D) may be expressed mathematically as per Equation 19.

$$FH \cong V_C \times G \quad \text{Equation 19:}$$

where, "G" is the gain factor of the VCO 112.

A process for locking a VCO to a high frequency signal FH may include dividing the high frequency signal FH into a lower frequency signal FL and configuring an SCRC 104 such that a Bridge reaches equilibrium when variations in the error voltage $V_{ERROR}$ provided to an integrator 108 result in a control signal $V_C$ being output by the integrator 108, with or without additional filtering, to a VCO 112 such that a high frequency signal FH is generated and is jittered about a given center frequency and within a given bandwidth.

It is to be appreciated that the operations described above are illustrative and are not intended herein to occur, for all embodiments of the present disclosure, in the order described, in sequence, by the controller or otherwise. Further, it is to be appreciated that one or more of the operations may be performed in parallel and operations may be not performed, as provided for any given use of an embodiment of the present disclosure.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. Further, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes and are not intended to be limiting to any orientation or configuration of any elements or sequences of operations for the various embodiments of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative of embodiments and not limiting. Changes in detail or structure may be made without departing from the basic elements of the invention as defined in the following claims.

What is claimed is:

1. A circuit, locking a voltage controlled oscillator at a high frequency, comprising:
   a voltage controlled oscillator (VCO); and
   an integrator operable to generate and output a control signal to the VCO;
   wherein the integrator is operable to receive an inverting signal and a reference signal;

wherein the control signal locks the VCO to a high frequency signal based upon the inverting signal;
wherein the inverting signal is received in response to a low frequency signal; and
wherein the low frequency signal is a quotient of the high frequency signal.

2. The circuit of claim 1, further comprising:
a frequency divider, coupled to the VCO, operable to:
receive the high frequency signal from the VCO;
divide the high frequency signal by a factor "F"; and
output, based on the dividing of the high frequency signal, the low frequency signal.

3. The circuit of claim 2,
wherein the frequency divider further comprises:
two or more flip-flop stages operable to successively divide the high frequency signal into the low frequency signal.

4. The circuit of claim 3,
wherein the low frequency signal has a given period $T_{FL}$; and
wherein during the given period $T_{FL}$, ripples are generated by the integrator in the control signal and the VCO generates jitter in a frequency of the high frequency signal.

5. The circuit of claim 4,
wherein the jitter distributes the high frequency signal over a wider frequency band; and
wherein an amplitude of an individual frequency component of the high frequency signal is reduced.

6. The circuit of claim 2,
wherein F equals thirty-two.

7. The circuit of claim 1,
wherein a period of the low frequency signal is generated as a given number of periods of the high frequency signal ($T_{FH}$);
wherein the low frequency signal has a given period TEL; and
wherein the circuit further comprises:
a frequency divider operable to output the low frequency signal; and
a switched capacitor resistor circuit (SCRC), coupled to the frequency divider and the integrator, operable to:
receive the low frequency signal from the frequency divider; and
based on a frequency of the low frequency signal, generates the inverting signal.

8. The circuit of claim 1, further comprising:
a switched capacitor resistor circuit (SCRC) coupled to the integrator;
wherein the SCRC is operable to:
receive the low frequency signal;
generate, in response to a frequency of the low frequency signal, the inverting signal by:
during a first phase of a given period $T_{FL}$ of the low frequency signal, coupling a switched capacitor to a ground potential; and
charging the switched capacitor by a second reference signal; and
during a second phase of the given period $T_{FL}$ of the low frequency signal, coupling the switched capacitor to the integrator; and
outputting the inverting signal to the integrator;
wherein the inverting signal comprises an inverting voltage signal and an inverting current signal; and
wherein the integrator is operable to:
force the inverting voltage signal to equal the reference signal; and
wherein the inverting current signal results in the integrator generating the control signal.

9. The circuit of claim 8,
wherein the integrator further comprises:
an op-amp further comprising:
an inverting node;
a non-inverting node; and
an output node; and
an integrating capacitor coupled to the non-inverting node;
wherein the integrating capacitor has an integrator capacitance;
wherein the switched capacitor has a switched capacitance;
wherein the VCO is coupled to the output node;
wherein the inverting signal further comprises an inverting voltage signal and an inverting current signal; and
wherein the inverting voltage signal is provided at the inverting node;
wherein, during the second phase, the inverting current signal charges the integrating capacitor;
wherein the reference signal is provided at the non-inverting node;
wherein the reference signal equals the second reference signal;
wherein the reference signal is generated from a supply voltage; and
wherein the control signal is generated based upon a product of the supply voltage times the switched capacitance and the product being divided by the integrator capacitance.

10. The circuit of claim 9,
wherein the SCRC further comprises:
a first switch for selectively coupling a top terminal of the switched capacitor, via a terminal A, to a ground potential, and via a terminal B, to the supply voltage;
a second switch for selectively coupling a bottom terminal of the switched capacitor, via a terminal C, to the integrator and via a terminal D, to a reference circuit; and
a discharge resistor R coupled at a bottom terminal to ground and at a top terminal to the inverting node and to terminal C of the second switch;
wherein the reference circuit further comprises:
a first reference resistor coupled between the supply voltage and to the non-inverting node; and
a second reference resistor coupled between the non-inverting node and the ground; and
wherein during the first phase of the given period $T_{FL}$, a discharge current flows from the integrating capacitor to ground via the discharge resistor R.

11. A circuit comprising:
a voltage controlled oscillator (VCO);
a reference circuit;
an integrator including an op-amp including:
an inverting node,
a non-inverting node coupled to the reference circuit, and
an output node coupled to the VCO, and
an integrator capacitor coupled to the non-inverting node and the output node;
a switched capacitor resistor circuit (SCRC) including:
a first switch,
a second switch, and
a switched capacitor coupled to the first switch and the second switch, the switched capacitor being selectively coupled:
   at a top terminal, to a ground potential or a supply voltage using the first switch;
   at a bottom terminal, to the inverting node or to the reference circuit using the second switch; and
a discharge resistor coupled between the ground potential and the inverting node,
wherein charging and discharging of the integrator capacitor results in the integrator generating an integrated signal used to generate a control signal provided to the VCO, the VCO is locked to and outputs a high frequency signal based on the control signal.

12. The circuit of claim 11, further comprising:
a frequency divider, coupled to the VCO and the SCRC; and
wherein the frequency divider generates a low frequency signal based on the high frequency signal received from the VCO.

13. The circuit of claim 12,
wherein the frequency divider further comprises:
   "N" flip-flop stages, operable to successively divide the high frequency signal; and
   wherein, the integrator is operable to generate ripples in the control signal; and
   wherein, based on the ripples in the control signal, the VCO is operable to generate jitter in a frequency of the high frequency signal.

14. The circuit of claim 13,
wherein N equals five stages;
wherein the ripples in the control signal are approximately fifteen millivolts (15 mV) peak-to-peak; and
wherein the jitter in the frequency of the high frequency signal is approximately fifteen megahertz (15 MHz).

15. The circuit of claim 12, further comprising:
a filter operable to:
   receive the integrated signal from the integrator;
   filter the integrated signal to generate the control signal; and
   output the control signal to the VCO.

16. The circuit of claim 12,
wherein a period of a low frequency signal is proportional to a resistance of a discharge resistor times a capacitance of the switched capacitor.

17. The circuit of claim 11,
wherein the reference circuit further comprises:
   a first reference resistor;
   a second reference resistor;
   a third reference resistor; and
   a fourth reference resistor;
wherein a Wheatstone bridge is formed by:
   a first divider string comprising a switched capacitor resistor coupled to the discharge resistor;
   a second divider string comprising the first reference resistor and the second reference resistor;
      wherein the second divider string generates a reference signal;
      wherein the reference signal is provided to the non-inverting node;
   wherein the Wheatstone bridge seeks equilibrium between the first divider string and the second divider string;
   wherein when terminal C is selected by the second switch, an inverting voltage signal charges the integrator capacitor; and
   wherein when equilibrium does not exist in the Wheatstone bridge, an inverting current signal is provided to the integrator capacitor in an inverted signal.

18. The circuit of claim 17,
wherein during a first phase,
   a third divider string, comprising the third reference resistor and the fourth reference resistor, supply a second reference signal to the switched capacitor resistor; and
wherein the second reference signal pre-charges the switched capacitor.

19. The circuit of claim 11, wherein:
the first switch includes a terminal A and a terminal B, and the second switch includes a terminal C and a terminal D;
the switched capacitor is selectively coupled:
   at the top terminal, to a ground potential, when the first switch selects terminal A, and to a supply voltage, when the first switch selects terminal B;
   at the bottom terminal, to the inverting node when the second switch selects terminal C, and to the reference circuit when the second switch selects terminal D;
a given period $T_{FL}$ for a low frequency signal includes a first phase followed by a second phase;
during the first phase of the given period $T_{FL}$, the first switch selects terminal A, the second switch selects terminal D, and charges received during a prior operating cycle from the SCRC and stored in the integrator capacitor are discharged to ground via the discharge resistor; and
during the second phase of the given period $T_{FL}$, the first switch selects terminal B, the second switch selects terminal C, and an inverting signal generated by the SCRC charges the integrator capacitor.

20. A method, of controlling a voltage controlled oscillator to a high frequency, comprising:
generating a low frequency signal based on a high frequency signal;
   wherein the high frequency signal is generated by the voltage controlled oscillator;
selectively generating inverting signals, using a switched capacitor resistor circuit referenced to a first reference voltage of a reference circuit, based on the low frequency signal; and
generating, based on the inverting signals, a control signal used to control the voltage controlled oscillator, the control signal being generated based on a second reference voltage from the reference circuit, the first reference voltage and the second reference voltage being between a supply voltage and a ground potential.

21. The method of claim 20,
wherein the low frequency signal is generated by a frequency divider;
wherein the switched capacitor resistor circuit comprising a switched capacitor and a discharge resistor;
wherein the inverting signals are controlled by:
   selectively switching a first switch coupling a top terminal of the switched capacitor between the supply voltage and the ground potential; and
   selectively switching a second switch coupling a bottom terminal of the switched capacitor between the reference circuit and an inverting node of an integrator;
wherein the low frequency signal occurs over a given period TEL that includes at least two phases;
wherein the selective switching of the first switch and the second switch occurs based on a then occurring phase for the given period $T_{FL}$;

wherein the second reference voltage is provided by the reference circuit to the integrator;

wherein ripples are generated in the control signal by the integrator; and wherein, based on the ripples, jitter is generated in a frequency of the high frequency signal by the voltage controlled oscillator.

\* \* \* \* \*